United States Patent [19]

Ikeda

[11] Patent Number: 5,175,607
[45] Date of Patent: Dec. 29, 1992

[54] SEMICONDUCTOR DEVICE AND MANUFACTURING METHOD THEREOF

[75] Inventor: Tatsuhiko Ikeda, Itami, Japan

[73] Assignee: Mitsubishi Denki Kabushiki Kaisha, Tokyo, Japan

[21] Appl. No.: 908,792

[22] Filed: Jul. 6, 1992

Related U.S. Application Data

[63] Continuation of Ser. No. 688,447, Apr. 22, 1991, abandoned.

[30] Foreign Application Priority Data

Apr. 26, 1990 [JP] Japan ................... 2-111102

[51] Int. Cl.[5] .......................................... H01L 27/02
[52] U.S. Cl. ....................... 257/511; 437/63; 437/141; 437/193; 437/247; 257/518
[58] Field of Search .............. 357/34, 40, 44, 59, 357/52; 437/63, 141, 193, 247

[56] References Cited

FOREIGN PATENT DOCUMENTS 0301468 2/1989 European Pat. Off. .

OTHER PUBLICATIONS

K. Toh et al., "A 23ps/2.1mW ECL Gate", ISSCC 89 Digest of Technical Papers, 1989, pp. 224-225.
C. Sung et al., "A 76 MHz Programmable Logic Sequencer", ISSCC 89 Digest of Technical Papers, 1989, pp. 118'119.

Primary Examiner—Edward J. Wojciechowicz
Attorney, Agent, or Firm—Oblon, Spivak, McClelland, Maier & Neustadt

[57] ABSTRACT

A p-type polycrystalline silicon layer (45) serving as the base electrode of an npn transistor and a p-type polycrystalline silicon layer (50) serving as the emitter electrode of a pnp transistor are simultaneously formed by forming a p-type polycrystalline silicon on the entire surface and patterning the same. Similarly, an n-type polycrystalline silicon layer (46) serving as the emitter electrode of the npn transistor and an n-type polycrystalline silicon layer (49) serving as the base electrode of the pnp transistor are simultaneously formed by forming an n-type polycrystalline silicon on the entire surface and patterning the same. Thus, electrodes can be formed without selective impurity implantation and the mask alignment therefor.

16 Claims, 11 Drawing Sheets

SEMICONDUCTOR DEVICE AND MANUFACTURING METHOD THEREOF

This application is a continuation of application Ser. No. 07/688,447 filed on Apr. 22, 1991, now abandoned.

BACKGROUND OF THE INVENTION

1. Field of the Invention

The present invention relates to a semiconductor device having vertical npn and pnp bipolar transistors which are formed on the same semiconductor substrate and a manufacturing method thereof.

2. Description of the Prior Art

Figure 6:
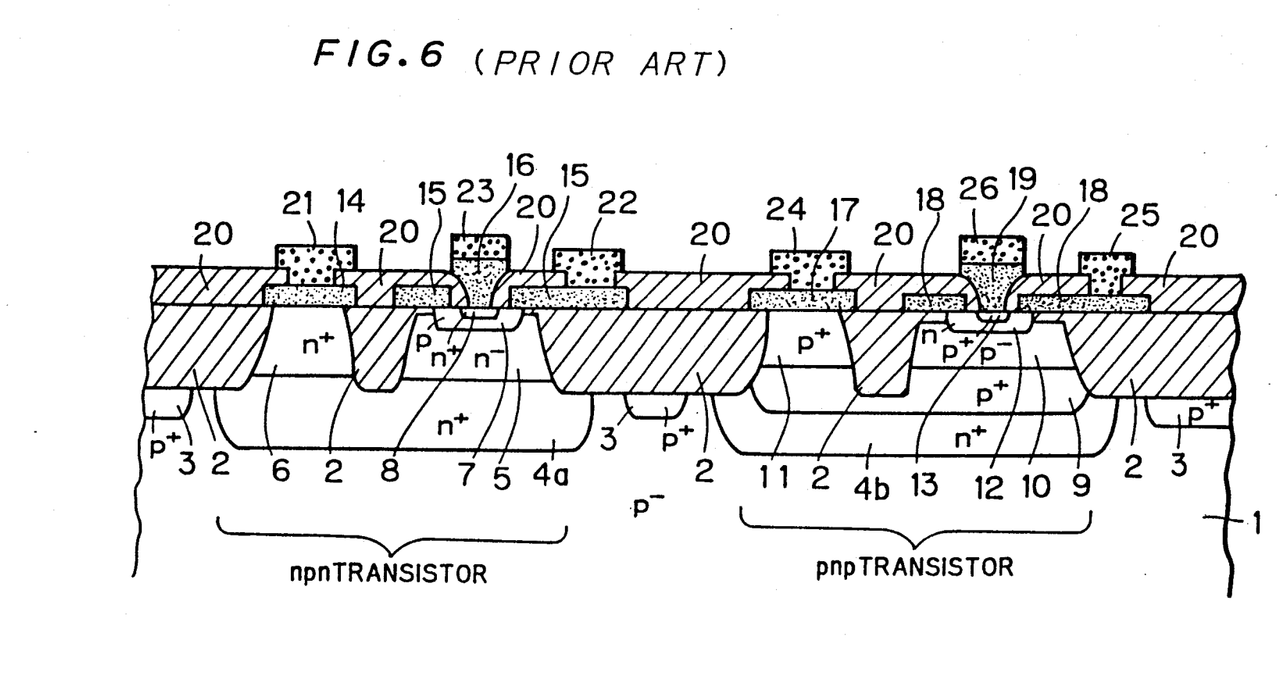
FIG. 6 is a cross-sectional structural view showing a conventional semiconductor device.

FIG. 6 is a cross-sectional structural view showing a conventional LSI in which vertical npn and pnp bipolar transistors are present miscellaneously, disclosed in "Electronic Information Communication Society, Technological Reseach Report SDM89-57". As shown in FIG. 6, npn and pnp transistor regions are respectively specified by element insulating films 2 formed on a $p^-$ type silicon substrate 1 and $p^+$ type channel cut layers 3 formed on the lower face thereof. The npn transistor region includes an $n^+$ type buried layer 4a, an $n^-$ type epitaxial layer 5 which serves as a collector, an $n^+$ type collector extraction layer 6, a p-type diffusion region 7 which serves as a base and an $n^+$ type diffusion region 8 which serves as an emitter. The pnp transistor region includes an $n^+$ type buried layer 4b, a $p^+$ type buried layer 9, a $p^-$ type diffusion layer 10 which serves as a collector, a $p^+$ type collector extraction layer 11, an n-type diffusion region 12 which serves as a base and a $p^+$ type diffusion region 13 which serves as an emitter.

In the npn transistor region, an n-type polycrystalline silicon layer 14 which is a collector electrode, p-type polycrystalline silicon layers 15 which are a base electrode and an n-type polycrystalline silicon layer 16 which is an emitter electrode are formed respectively on the $n^+$ type collector extraction layer 6, the p-type diffusion region 7 and the $n^+$ type diffusion region 8. In the pnp transistor region, a p-type polycrystalline silicon layer 17 which is a collector electrode, n-type polycrystalline silicon layers 18 which are a base electrode and a p-type polycrystalline silicon layer 19 which is an emitter electrode are formed respectively on the $p^+$ type collector extraction layer 11, the n-type diffusion region 12 and the $p^+$ type diffusion region 13. The polycrystalline silicon layers 14–19 are insulated from each other by insulating films 20. Through openings provided in the insulating films 20, collector and base metal wirings 21 and 22 are formed respectively on the polycrystalline silicon layers 14 and 15 in the npn transistor region, and collector and base metal wirings 24 and 25 are formed respectively on the polycrystalline silicon layers 17 and 18 in the pnp transistor region. An emitter metal wiring 23 is formed on the polycrystalline silicon layer 16 in the npn transistor region, and an emitter metal wiring 26 is formed on the polycrystalline silicon layer 19 in the pnp transistor region.

In manufacturing the semiconductor device of FIG. 6, after the $n^+$ type buried layers 4a and 4b and the $p^+$ type buried layer 9 are formed on the $p^-$ type silicon substrate 1, the $n^-$ type epitaxial layer 5 is deposited on the entire surface. Next, the element insulating film 2 is provided so as to form the $p^+$ type channel cut layer 3 on the bottom, to execute element isolation. Thereafter, the $p^-$ type diffusion layer 10, the $n^+$ type collector extraction layer 6 and the $p^+$ type collector extraction layer 11 are formed in series by selective diffusion.

After first polycrystalline silicon is deposited on the entire surface, p-type impurities are introduced selectively only into the regions which become the base electrode of the npn transistor and the collector electrode of the pnp transistor by the use of a first mask (not shown), while n-type impurities are introduced selectively only into the regions which become the collector electrode of the npn transistor and the base electrode of the pnp transistor by the use of a second mask (not shown). Subsequently, the first polycrystalline silicon is patterned by selective etching, thereby the n-type polycrystalline silicon layers 14 and 18 and the p-type polycrystalline silicon layers 15 and 17 being formed.

After the insulating film 20 is formed on the entire surface, openings are formed and the p-type diffusion region 7 and the n-type diffusion region 12 are formed through the openings. Thereafter, the deposited insulating film is left on the sidewalls of the polycrystalline silicon layers 15 and 18 which are the base electrodes. Second polycrystalline silicon is deposited on the entire surface, and then n-type impurities are introduced selectively only into the region which becomes the emitter electrode of the npn transistor by the use of a third mask (not shown), while p-type impurities are introduced selectively only into the region which becomes the emitter electrode of the pnp transistor by the use of a fourth mask (not shown). Subsequently, the second polycrystalline silicon is patterned by selective etching, thereby the n-type polycrystalline silicon layer 16 and the p-type polycrystalline silicon layer 19 being formed. Heat treatment is performed, thereby $n^+$ type diffusion region 8 and $p^+$ type diffusion region 13 being formed through the diffusion from the polycrystalline silicon layers 16 and 19. Finally, the metal wirings 21–26 are formed and thus the semiconductor device of FIG. 6 is accomplished.

In the conventional semiconductor device as above constructed, it is necessary for the formation of the base and emitter electrodes to selectively pour the impurities twice, of n-type and p-type, by means of the first and second masks after the formation of the first polycrystalline silicon, and furthermore to selectively pour the impurities twice, of n-type and p-type, by means of the third and fourth masks after the formation of the second polycrystalline silicon. That is, the base and emitter electrodes cannot be formed without four-times mask alignments in total and four-times selective pourings of impurities in total. Therefore, too many steps are required.

SUMMARY OF THE INVENTION

The present invention is directed to a semiconductor device having vertical npn and pnp bipolar transistors in which base, emitter and collector regions are respectively formed on the same semiconductor substrate. According to the present invention, the semiconductor device comprises a first base electrode made up of a p-type conductive layer which is formed on the base region of the npn bipolar transistor, a first emitter electrode made up of a p-type conductive layer which is formed on the emitter region of the pnp bipolar transistor, a first insulating film which coats the first base electrode, a second insulating film which coats the first emitter electrode, a second emitter electrode made up of an n-type conductive layer which is formed on the emitter region of the npn bipolar transistor, the second emitter electrode being insulated from the first base electrode by the first insulating film, and a second base electrode made up of an n-type conductive layer which is formed on the base region of the pnp bipolar transistor, the second base electrode being insulated from the first emitter electrode by the second insulating film.

The present invention is also directed to a manufacturing method of a semiconductor device having vertical npn and pnp bipolar transistors in which base, emitter and collector regions are respectively formed on the same semiconductor substrate. According to the present invention, the manufacturing method comprises the steps of preparing a semiconductor substrate, providing on the semiconductor substrate an n-type first island which becomes the collector region of the npn bipolar transistor and a p-type second island which becomes the collector region of the pnp bipolar transistor, selectively forming in a surface of the first island a p-type first semiconductor region which becomes the base region of the npn bipolar transistor, selectively forming in a surface of the second island an n-type second semiconductor region which becomes the base region of the pnp bipolar transistor, selectively forming on the first semiconductor region a p-type first conductive layer which becomes a base electrode of the npn bipolar transistor and simultaneously on the second semiconductor region a p-type second conductive layer which becomes an emitter electrode of the pnp bipolar transistor, by forming a p-type conductive layer on an entire surface and patterning the p-type conductive layer, coating the first conductive layer with a first insulating film and simultaneously the second conductive layer with a second insulating film, selectively forming on the first semiconductor region an n-type third conductive layer which becomes an emitter electrode of the npn bipolar transistor while insulating the third conductive layer from the first conductive layer by the first insulating film, and simultaneously on the second semiconductor region an n-type fourth conductive layer which becomes a base electrode of the pnp bipolar transistor while insulating the fourth conductive layer from the second conductive layer by the second insulating film, by forming an n-type conductive layer on an entire surface and patterning the n-type conductive layer, and diffusing n-type impurities from the fourth conductive layer to the first semiconductor region to form selectively in a surface of the first semiconductor region an n-type third semiconductor region which becomes the emitter region of the npn bipolar transistor, and simultaneously p-type impurities from the second conductive layer to the second semiconductor region to form selectively in a surface of the second semiconductor region a p-type fourth seconductor region which becomes the emitter region of the pnp bipolar transistor, by heat treatment.

In a semiconductor device according to the present invention, since the first base and emitter electrodes made up of the p-type conductive layers are coated with the first and second insulating films, the first base and emitter electrodes can be formed, for example, through the steps of forming the p-type conductive layer on the entire surface and patterning, eliminating the need for selective implantation of the impurities and mask alignments therefor. Furthermore, since the second base and emitter electrodes made up of the n-type conductive layers are insulated from the first base and emitter electrodes by the first and second insulating films, the second base and emitter electrodes can be formed, for example, through the steps of forming the n-type conductive layer on the entire surface and patterning, eliminating the need for selective implantation of the impurities and mask alignments therefor.

In a manufacturing method of a semiconductor device according to the present invention, since the p-type conductive layer is formed on the entire surface and patterned to form the first and second conductive layers, the selective implantation of the impurities and the mask alignments therefor are not required. Furthermore, since the n-type conductive layer is formed on the entire surface and patterned to form the third and fourth conductive layers, the selective implantation of the impurities and the mask alignments therefor are not required.

As a result, according to the present invention, a semiconductor device capable of forming base and emitter electrodes in less steps and a manufacturing method thereof can be achieved.

Accordingly, it is an object of the present invention to provide a semiconductor device capable of forming base and emitter electrodes in less steps and a manufacturing method thereof.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
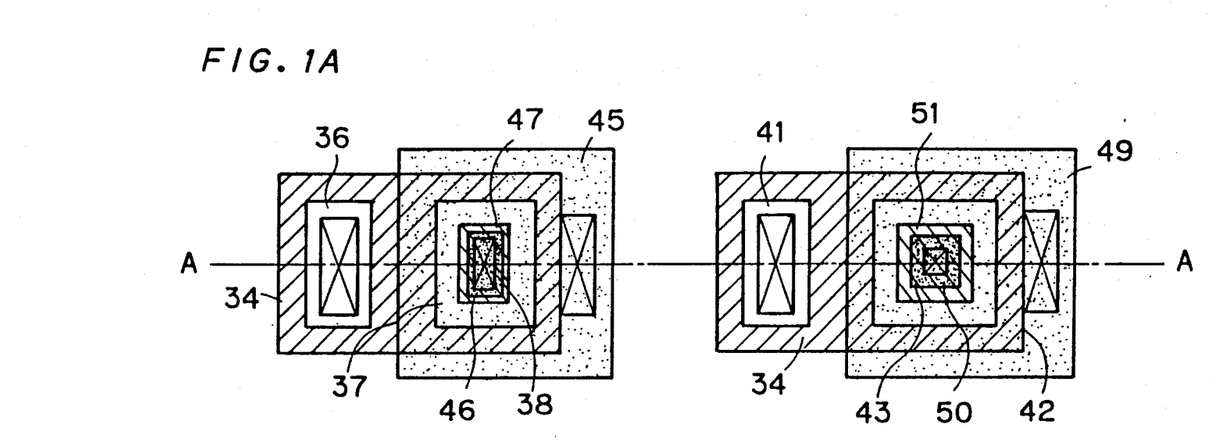
FIG. 1A is a plan view showing a plane pattern of one embodiment of a semiconductor device according to the present invention.
Figure 1B:
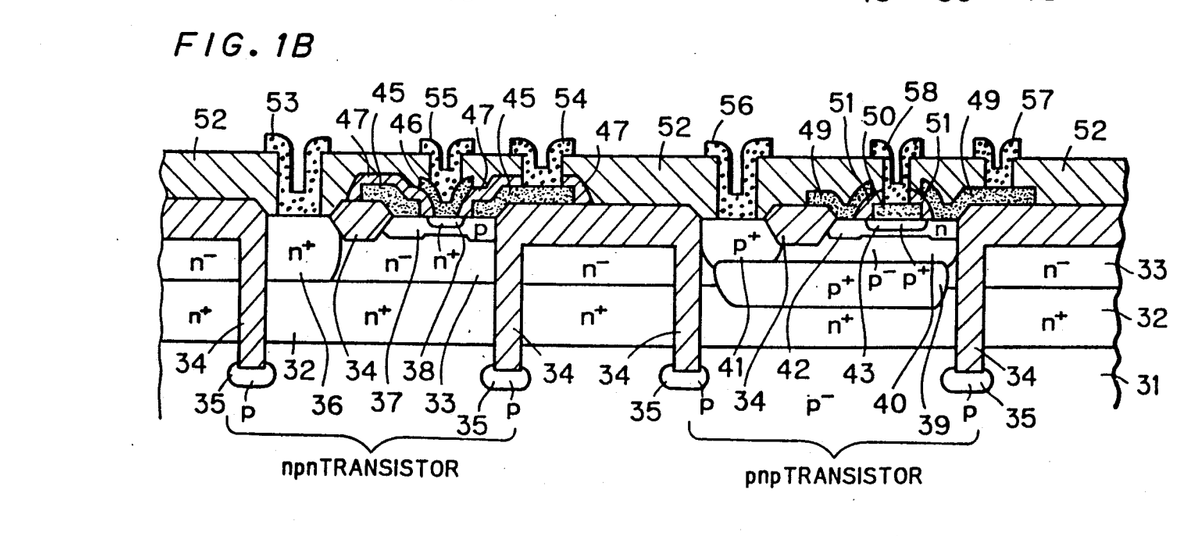
FIG. 1B is a cross-sectional view showing a cross-sectional structure taken along the line A—A of FIG. 1A.

FIG. 1A is a plan view showing a plane pattern of one preferred embodiment of a semiconductor device according to the present invention, and FIG. 1B is a cross-sectional view showing a cross-sectional structure taken along the line A—A of FIG. 1A. As shown in FIG. 1B, an n+ type buried layer 32 and an n− type epitaxial layer 33 are deposited on a p− type silicon substrate 31. The n+ type buried layer 32 and the n− type epitaxial layer 33 are divided into some parts by element insulating films 34 which extend from the surface to the p− type silicon substrate 31 and p-type channel cut layers 35 formed on the bottom thereof, so that an island of an npn transistor region and an island of a pnp transistor region are specified.

In the npn transistor region, the n+ type buried layer 32 acts as a buried collector, and the n− type epitaxial layer 33 acts as a collector. The npn transistor region includes an n+ type collector extraction layer 36, a p-type base diffusion region 37 and an n+ type emitter diffusion region 38. On the other hand, the pnp transistor region includes a p+ type buried collector layer 39 formed in the interface of the n+ type buried layer 32 and the n− type epitaxial layer 33, a p− type collector diffusion layer 40, a p+ type collector extraction layer 41, an n-type base diffusion region 42 and a p+ type emitter diffusion region 43.

In the npn transistor region, p-type polycrystalline silicon layers 45 which are a base electrode and an n-type polycrystalline silicon layer 46 which is an emitter electrode are formed on the p-type base diffusion region 37 and the n+ type emitter diffusion region 38, respectively. The p-type polycrystalline silicon layers 45 are coated with insulating films 47, thereby being insulated from the n-type polycrystalline silicon layer 46. In the pnp transistor region, n-type polycrystalline silicon layers 49 which are a base electrode and a p-type polycrystalline silicon layer 50 which is an emitter electrode are formed on the n-type base diffusion region 42 and the p+ type emitter diffusion region 43, respectively. The p-type polycrystalline silicon layer 50 is coated with insulating films 51, thereby being insulated from the n-type polycrystalline silicon layers 49. Thus, in the preferred embodiment, the p-type polycrystalline silicon layers 45 and 50 are, by being coated with the insulating films 47 and 51, insulated from the n-type polycrystalline silicon layers 46 and 49.

The entire surface is coated with a passivation film 52. The material of the passivation film 52 can be, for example, BPSG and SOG. A film having good flatness is required for the material. Through openings or contact holes formed in the passivation film 52 and the insulating films 51 there-underneath, collector, base and emitter metal wirings or interconnections 53, 54 and 55 are formed respectively on the n+ type collector extraction layer 36, the p-type polycrystalline silicon layers 45 and the n-type polycrystalline silicon layer 46 in the npn transistor region, and collector, base and emitter metal wirings or interconnections 56, 57 and 58 are formed respectively on the p+ type collector extraction layer 41, the n-type polycrystalline silicon layers 49 and the p-type polycrystalline silicon layer 50. The material of the metal wirings 53-58 may be, for example, AlSi/TiN, AlSiCu/TiN and, if possible, AlCu and Cu. It is necessary to lower the resistivity of the material and increase the migration resistance thereof.

Figure 2A:
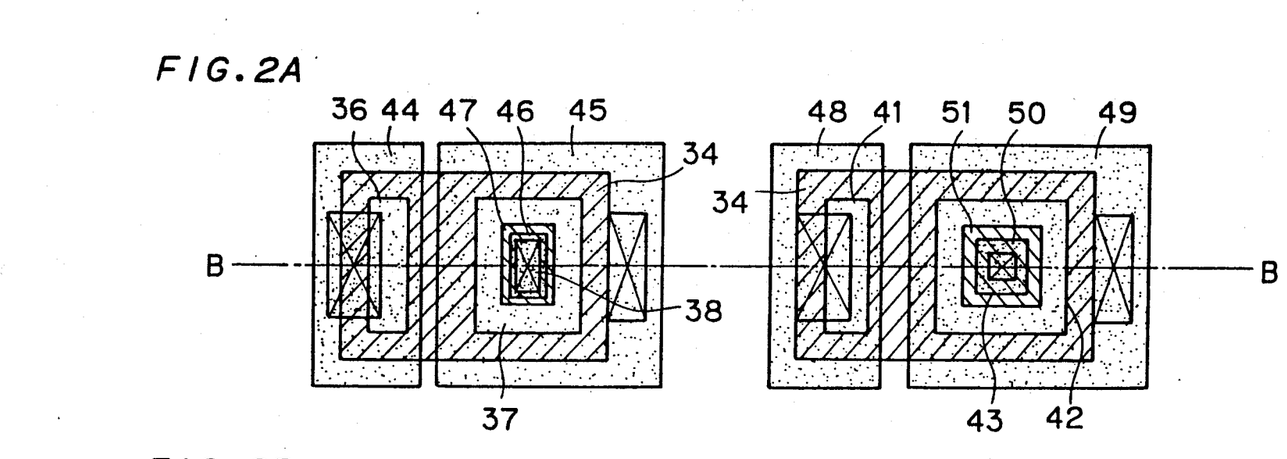
FIG. 2A is a plan view showing a plane pattern of another embodiment of the semiconductor device according to the present invention.
Figure 2B:
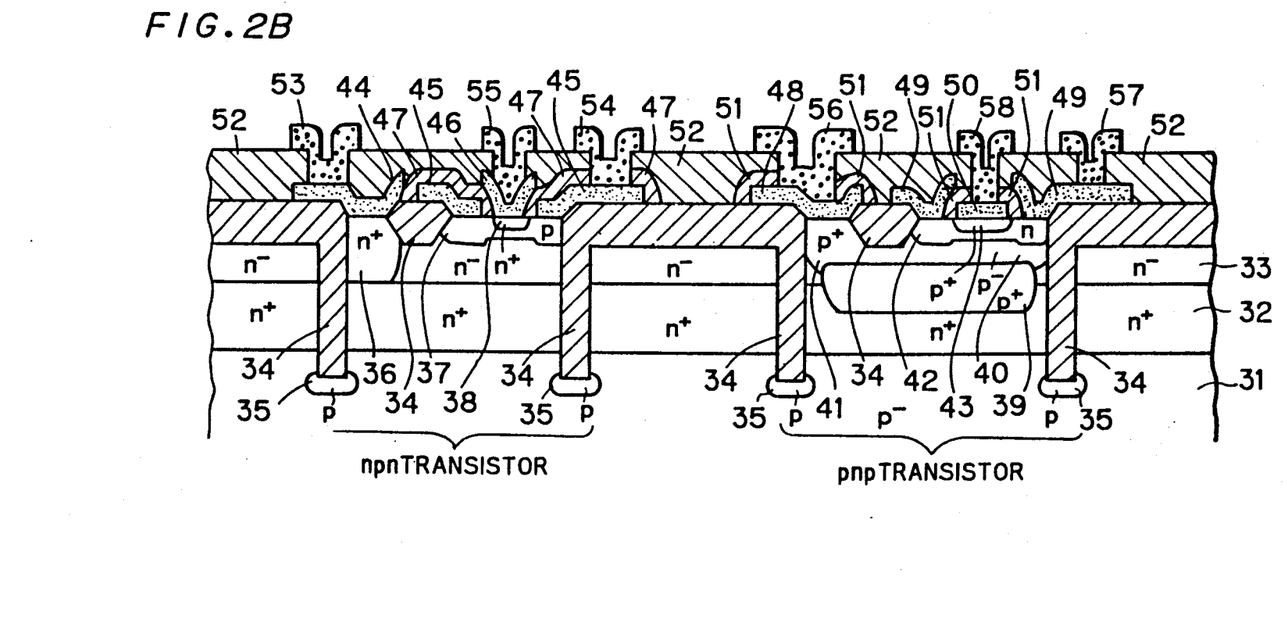
FIG. 2B is a cross-sectional view showing a cross-sectional structure taken along the line B—B of FIG. 2A.

FIG. 2A is a plan view showing a plane pattern of another preferred embodiment of the semiconductor device according to the present invention, and FIG. 2B is a cross-sectional view showing a cross-sectional structure taken along the line B—B of FIG. 2A. In the preferred embodiment, an n-type polycrystalline silicon layer 44 which is a collector electrode is provided on the n+ type collector extraction layer 36 of the npn transistor, and a p-type polycrystalline silicon layer 48 which is a collector electrode is provided on the p+ type collector extraction layer 41 of the pnp transistor. Similarly to the p-type polycrystalline silicon layer 50, the p-type polycrystalline silicon layer 48 is coated with the insulating films 51. The collector metal wiring 53 of the npn transistor is formed on the n-type polycrystalline silicon layer 44 through an opening provided in the passivation film 52, and the collector metal wiring 56 of the pnp transistor is formed on the p-type polycrystalline silicon layer 48 through an opening provided in the passivation film 52 and the insulating films 51. Other constructions are similar to those of the semiconductor device of FIGS. 1A and 1B.

The following table shows available sizes, ranges of impurity density and future direction of the above-described respective layers and regions. As for the layers and regions, only the reference numbers thereof are shown.

| layer, region | size (depth, thickness) | impurity density $(cm^{-3})$ | future direction |
|---|---|---|---|
| 32 | 1–3 μm | $2 \times 10^{19} - 5 \times 10^{19}$ | thinner |
| 33 | 1–4 μm | $5 \times 10^{15} - 1 \times 10^{16}$ | thinner |
| 34 | 4–8 μm | — | — |
| 35 | ~1 μm | $1 \times 10^{17} - 5 \times 10^{17}$ | — |
| 36 | 1–4 μm | $1 \times 10^{19} - 3 \times 10^{19}$ | lower-resistive |
| 37 | 0.05–0.15 μm | $10^{17} - 10^{18}$ | shallower |
| 38 | 0.05–0.1 μm | $1 \times 10^{20} - 3 \times 10^{20}$ | shallower |
| 39 | 1–3 μm | $5 \times 10^{17} - 1 \times 10^{18}$ | denser, thinner |
| 40 | 1–4 μm | $1 \times 10^{16} - 2 \times 10^{16}$ | thinner |
| 41 | 1–4 μm | $1 \times 10^{19} - 3 \times 10^{19}$ | lower-resistive |
| 42 | 0.2–0.5 μm | $5 \times 10^{16} - 5 \times 10^{17}$ | shallower |
| 43 | 0.1–0.4 μm | $1 \times 10^{20} - 5 \times 10^{20}$ | shallower |
| 44 | 100–300 nm | $1 \times 10^{20} - 5 \times 10^{20}$ | thinner, lower-resistive |
| 45 | 200–400 nm | $1 \times 10^{19} - 5 \times 10^{20}$ | thinner, lower-resistive |
| 46 | 100–300 nm | $1 \times 10^{20} - 5 \times 10^{20}$ | thinner, lower-resistive |
| 47, 51 | 0.2–0.5 μm | — | — |
| 48 | 200–400 nm | $1 \times 10^{19} - 5 \times 10^{20}$ | thinner, lower-resistive |
| 49 | 100–300 nm | $1 \times 10^{20} - 5 \times 10^{20}$ | thinner, lower-resistive |
| 50 | 200–400 nm | $1 \times 10^{19} - 5 \times 10^{20}$ | thinner, lower-resistive |
| 52 | 0.5–1.0 μm | — | — |
| 53–58 | 0.5–1.0 μm | — | — |

Referring now to FIGS. 3A–3L, an example of the manufacturing method of the aforesaid semiconductor device will be explained hereinafter.

Figure 3A:
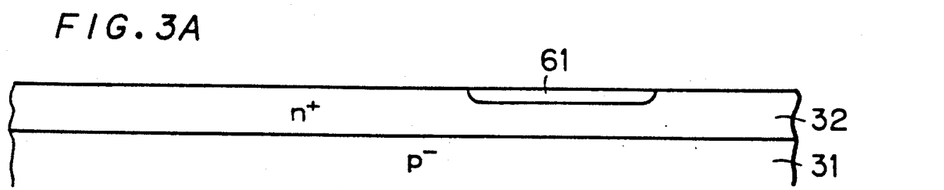
FIGS. 3A–3L are cross-sectional views showing an example of manufacturing steps of the structure shown in FIGS. 1B or 2B.

As shown in FIG. 3A, n-type impurities are diffused on the entire surface of the p− type silicon substrate 31 to form the n+ type buried layer 32. P-type impurities are selectively poured on the surface of the n+ type buried layer 32, thereby a p-type impurities poured region 61 being formed.

Figure 3B:
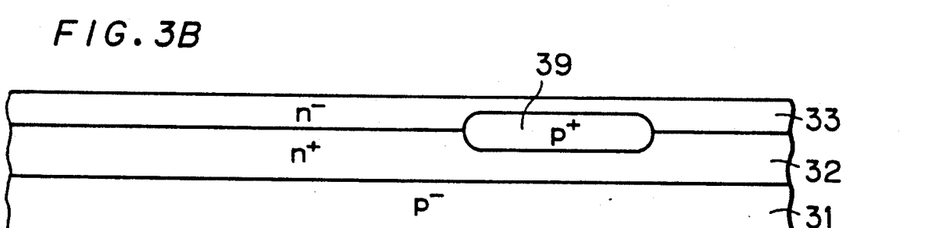

Next, as shown in FIG. 3B, the n− type epitaxial layer 33 is epitaxially grown on the entire surface. During the epitaxial growth, the p-type impurities in the p-type impurities poured region 61 are diffused, so that the p+ type collector buried layer 39 is formed in the interface of the n+ type buried layer 32 and the n− type epitaxial layer 33.

Figure 3C:
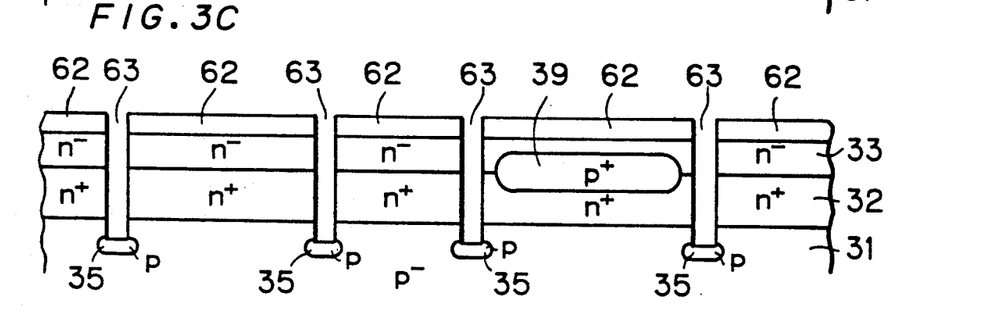

As shown in FIG. 3C, a mask 62 is formed on the n− type epitaxial layer 33. By selective etching with the mask 62, trenches 63 which extend to the p− type silicon substrate 31 are digged. Thereafter, p-type impurities are selectively poured into the bottoms of the trenches 63 and diffused thereat, so that the p-type channel cut layers 35 are formed.

Figure 3D:
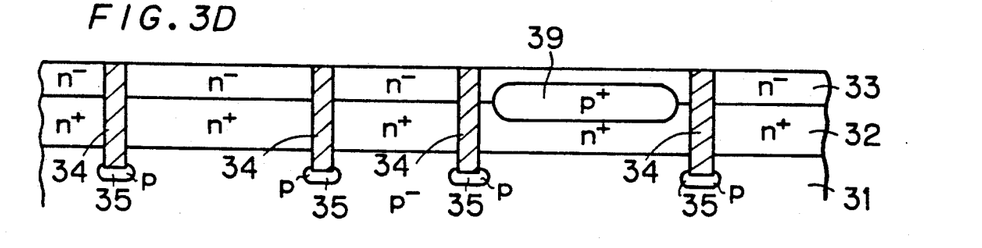

After the mask 62 is removed, silicon dioxide is deposited on the entire surface to fill up the trenches 63 therewith. The silicon dioxide deposited on the surface is removed by etchback, thereby the element insulating films 34 being formed inside the trenches 63, as shown in FIG. 3D.

Figure 3E:
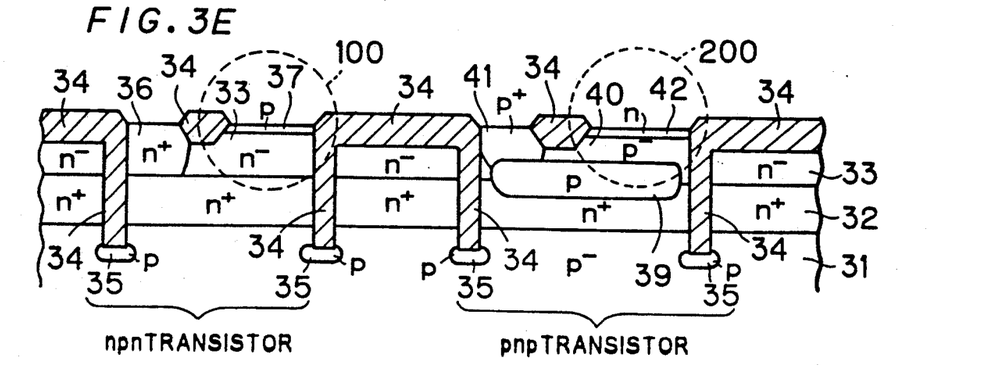

Next, as shown in FIG. 3E, p-type impurities are selectively diffused inside the n⁻ type epitaxial layer 33 in the pnp transistor region to form the p⁻ type collector diffusion layer 40. After the element insulating films 34 are formed on the surface by a selective oxidation method, n-type impurities with high density are selectively diffused inside the n⁻ type epitaxial layer 33 in the npn transistor region to form the n⁺ type collector extraction layer 36, while p-type impurities with high density are selectively diffused inside the n⁻ type epitaxial layer 33 in the pnp transistor region to form the p⁺ type collector extraction layer 41. Alternatively, the order of the steps of forming the element insulating films 34 on the surface end forming the n⁺ and p⁺ type collector extraction layers 36 and 41 may be reversed. Thereafter, p-type impurities are selectively diffused on the surface of the n⁻ type epitaxial layer 33 in the npn transistor region to form the p-type base diffusion region 37, while n-type impurities are selectively diffused on the surface of the p⁻ type collector diffusion layer 40 in the pnp transistor region to form the n-type base diffusion region 42.

FIGS. 3F–3L showing the following steps illustrate only the inside of a circle 100 of FIG. 3E in the npn transistor region and the inside of a circle 200 of FIG. 3E in the pnp transistor region. The left halves of FIGS. 3F–3L show the inside of the circle 100, and the right halves thereof show the inside of the circle 200.

Figure 3F:
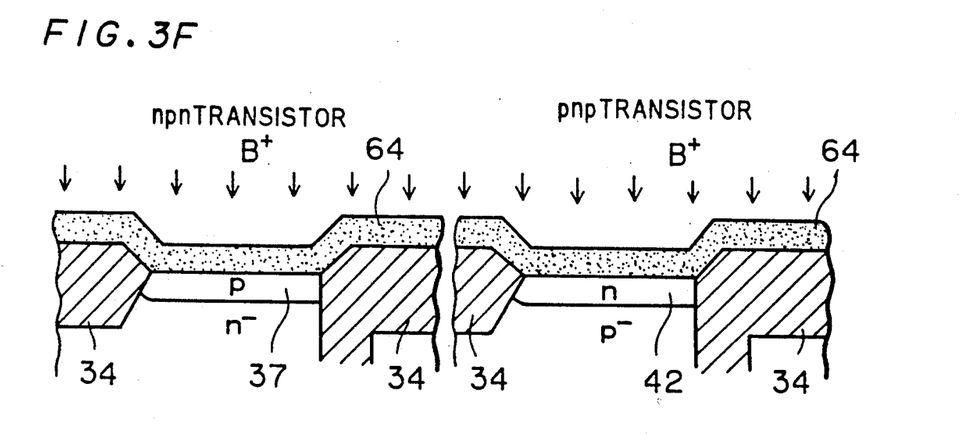

After the step of FIG. 3E, first layered polycrystalline silicon 64 is deposited on the entire surface, as shown in FIG. 3F. P-type impurities such as boron (B⁺) are introduced on the entire surface of the first layered polycrystalline silicon 64, to thereby render the first layered polycrystalline silicon 64 into p-type.

Figure 3G:
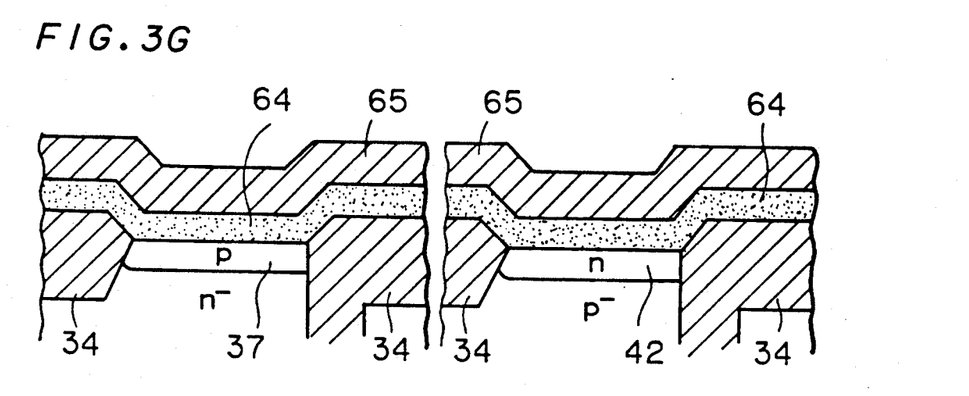

Next, an insulating film 65 is deposited on the entire surface of the first layered polycrystalline silicon 64, as shown in FIG. 3G.

Figure 3H:
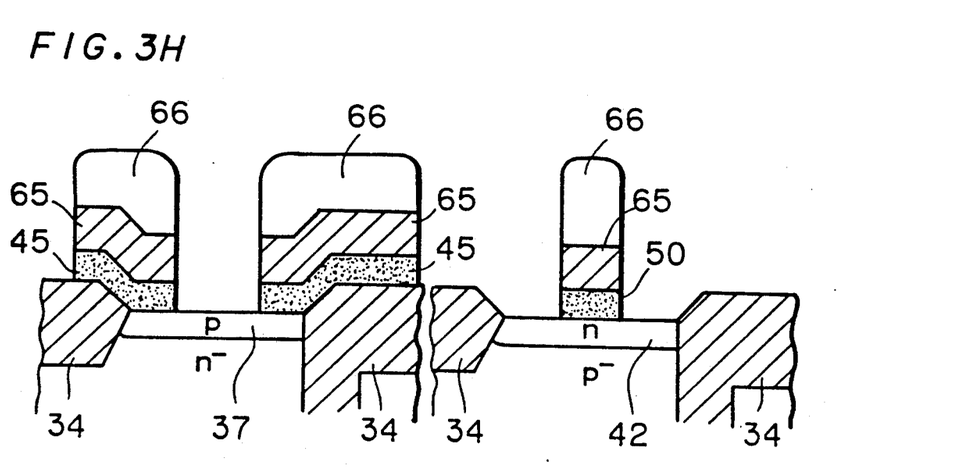

As shown in FIG. 3H, a photo-resist pattern 66 is formed on the insulating film 65. Masked with the photo-resist pattern 66, the insulating film 65 and the first layered polycrystalline silicon 64 are etched. The first layered polycrystalline silicon 64 which is left after the etching becomes the p-type polycrystalline silicon layers 45 which are the base electrode in the npn transistor region and the p-type polycrystalline silicon layer 50 which is the emitter electrode in the pnp transistor region. In the case of providing the p-type polycrystalline silicon layer 48 which is the collector electrode as shown in the preferred embodiment of FIGS. 2A and 2B, the p-type polycrystalline silicon layer 48 is also formed simultaneously in this step.

Figure 3I:
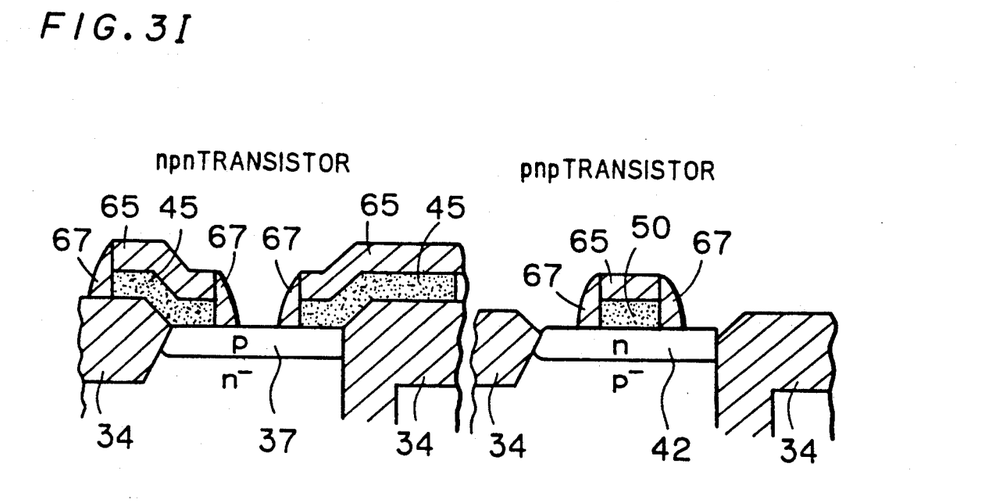

After the removal of the photo-resist pattern 66, an insulating film is deposited on the entire surface. By anisotropic etching, sidewalls 67 which are insulators are formed on the side faces of the p-type polycrystalline silicon layers 45 and the insulating films 65 in the npn transistor region and on the side faces of the p-type polycrystalline silicon layer 50 and the insulating film 65 in the pnp transistor region, as shown in FIG. 3I. In the npn transistor region, the insulating films 47 of FIGS. 1B and 2B are formed by the insulating films 65 and the sidewalls 67. In the pnp transistor region, the insulating films 51 of FIGS. 1B and 2B are formed by the insulating film 65 and the sidewalls 67.

Figure 3J:
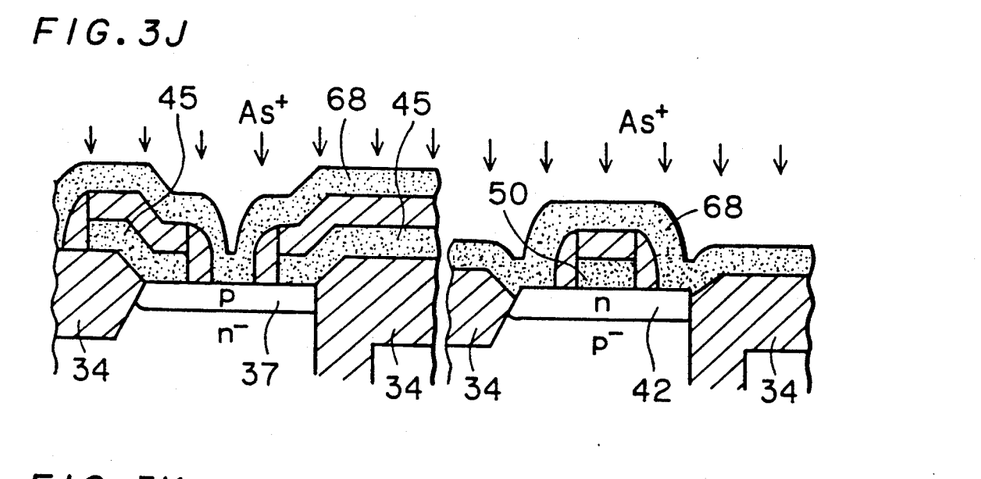

As shown in FIG. 3J, on the entire surface is deposited second layered polycrystalline silicon 68, which is rendered into n-type by introducing n-type impurities such as arsenic (As⁺) on the entire surface thereof.

Figure 3K:
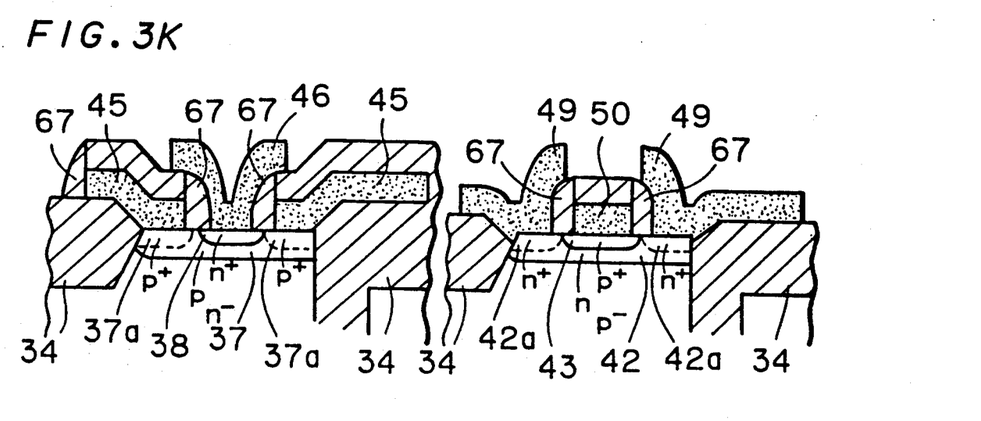

Next, as shown in FIG. 3K, the second layered polycrystalline silicon 68 is selectively etched away to leave a predetermined pattern. Accordingly, the n-type polycrystalline silicon layer 46 in contact with the p-type base diffusion region 37 is formed in the npn transistor region, while the n-type polycrystalline silicon layers 49 in contact with the n-type base diffusion region 42 are formed in the pnp transistor region. In the case of providing the n-type polycrystalline silicon layer 44 which is the collector electrode in the npn transistor region as shown in the preferred embodiment of FIGS. 2A and 2B, the n-type polycrystalline silicon layer 44 is also formed simultaneously in this step. The n-type polycrystalline silicon layers 46 and 49 are insulated or isolated in self-alignment from the p-type polycrystalline silicon layers 45 and 50 by the sidewalls 67. Impurities are diffused from the p-type and n-type polycrystalline silicon layers 45, 46, 49 and 50 by heat treatment, so that the n⁺ type emitter diffusion region 38 and p⁺ type external base diffusion regions 37a are formed inside the p-type base diffusion region 37 in the npn transistor region, and the p⁺ type emitter diffusion region 43 and n⁺ type external base diffusion regions 42a are formed inside the n-type base diffusion region 42 in the pnp transistor region.

Figure 3L:
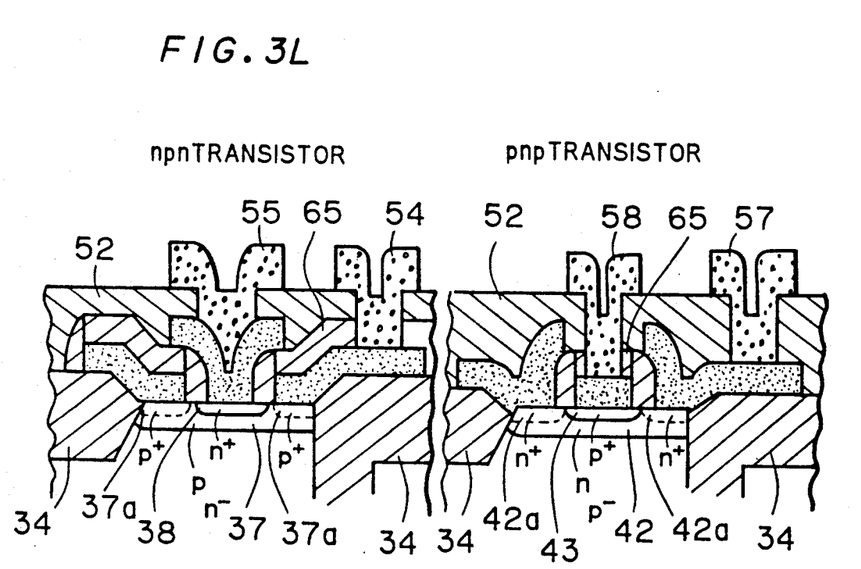

Finally, as shown in FIG. 3L, the entire surface is coated with the passivation film 52. Contact holes are bored in the passivation film 52 and the insulating films 65 there-underneath, which are subjected to metallizing treatment, thereby being formed the base and emitter metal wirings 54, 55, 57 and 58 and the collector metal wirings 53 and 56 not shown. Thus, the semiconductor device of FIG. 1B or FIG. 2B is accomplished.

According to this preferred embodiment, after the formation of the first layered polycrystalline silicon 64 on the entire surface, the first layered polycrystalline silicon 64 is rendered into p-type by pouring the p-type impurities on the entire surface thereof and is furthermore subjected to the patterning. Thereby, simultaneously formed are the p-type polycrystalline silicon layers 45 which are the base electrode of the npn transistor and the p-type polycrystalline silicon layer 50 which is the emitter electrode of the pnp transistor. The p-type polycrystalline silicon layers 45 and 50 are coated with the insulating films 47 and 51 (or the insulating films 65 and the sidewalls 67), and then the second layered polycrystalline silicon 68 is formed on the entire surface. The second layered polycrystalline silicon 68 is rendered into n-type by pouring the n-type impurities on the entire surface thereof and is furthermore subjected to the patterning. Thereby, simultaneously formed are the n-type polycrystalline silicon layer 46 which is the emitter electrode of the npn transistor and the n-type polycrystalline silicon layers 49 which are the base electrode of the pnp transistor. Therefore, unlike the prior art, it is unnecessary to pour the impurities selectively for the purpose of distributing the p-type and n-type impurities over the first and second layered polycrystalline silicons to the desired regions, and to execute mask alignments therefor. Accordingly, the manufacturing steps are simplified.

If the p-type polycrystalline silicon and n-type polycrystalline silicon which have been doped with impurities are deposited respectively as the first and second layered polycrystalline silicons 64 and 68, the following step of pouring the p-type and n-type impurities is not required.

Figure 4A:
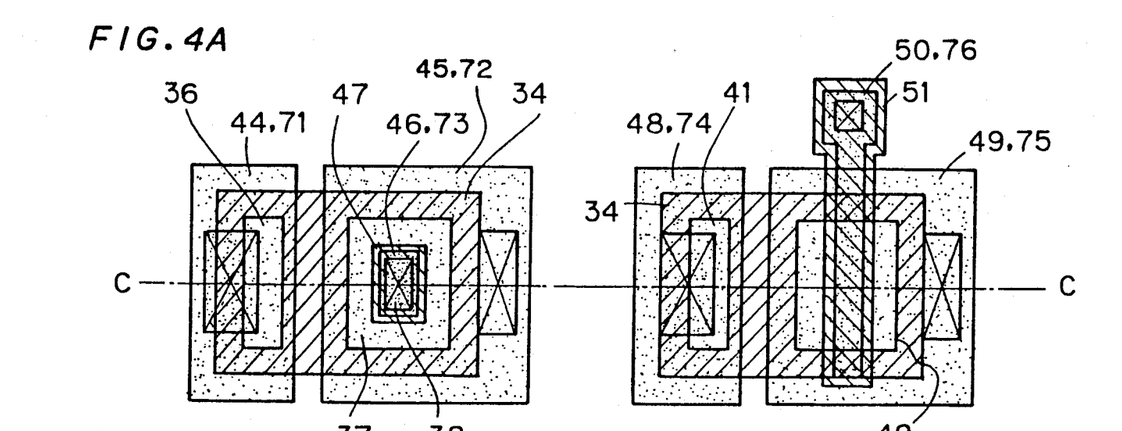
FIG. 4A is a plan view showing a plane pattern of still another embodiment of the semiconductor device according to the present invention.
Figure 4B:
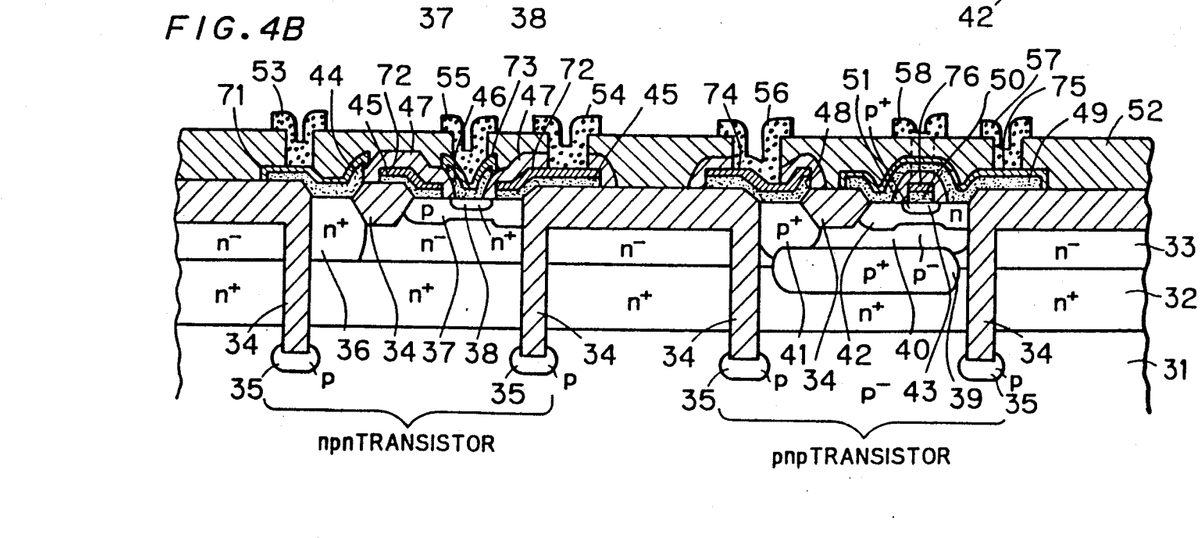
FIG. 4B is a cross-sectional view showing a cross-sectional structure taken along the line C—C of FIG. 4A.

FIG. 4A is a plan view showing a plane pattern of still another preferred embodiment of the semiconductor device according to the present invention, and FIG. 4B is a cross-sectional view showing a cross-sectional structure taken along the line C—C of FIG. 4A. According to the preferred embodiment, for lowering the resistivity of electrodes and rendering electrodes minuter, metal silicide layers 71, 72, 73, 74, 75 and 76 such as $MoSi_2$, $TiSi_2$ and $WSi_2$ are formed on the polycrystalline silicon layers 44, 45, 46, 48, 49 and 50 respectively to produce each electrode with the two-layer structure of impurity doped polycrystalline silicon and metal silicide. The metal silicide layers 71-76 may be, for example, about 0.05-0.2 μm in thickness. With the lower resistivity of the electrodes, the emitter metal wiring 58 contacts the emitter electrode of the pnp transistor (or the p-type polycrystalline silicon layer 50 and the metal silicide layer 76) at a distant place from the $p^+$ type emitter diffusion region 43. As a result, the $p^+$ type emitter diffusion region 43 can be formed on a small scale, and the semiconductor device is capable of high-speed operation and has better frequency characteristics. Other constructions are similar to those of the semiconductor device of FIGS. 2A and 2B.

Referring now to FIGS. 5A-5F, a manufacturing method of the semiconductor device of FIGS. 4A and 4B are described.

Figure 5A:
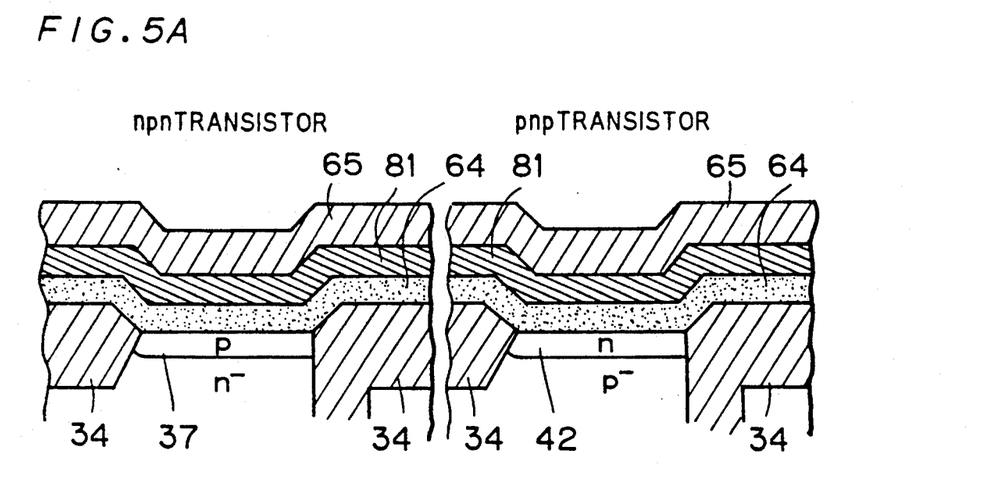
FIGS. 5A–5F are cross-sectional views showing an example of manufacturing steps of the structure shown in FIG. 4B.

The step of FIG. 3F and the preceding steps are similar to those in the aforesaid manufacturing method. After the step of FIG. 3F, high melting point metal silicide 81 and the insulating film 65 are deposited in series on the entire surface of the first layered p-type polycrystalline silicon 64, as shown in FIG. 5A.

Figure 5B:
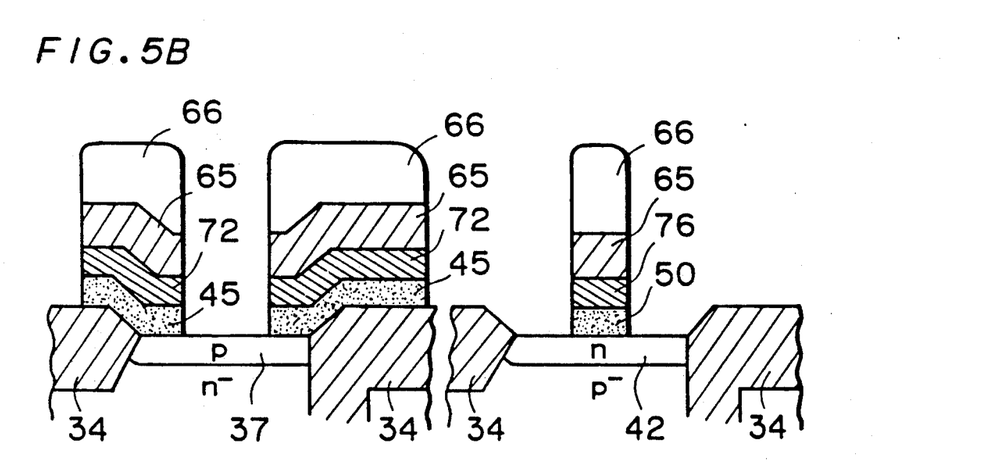

Next, as shown in FIG. 5B, the photo-resist pattern 66 is formed on the insulating film 65. Masked with the photo-resist pattern 66, the insulating film 65, the metal silicide 81 and the polycrystalline silicon 64 are etched. The metal silicide 81 which is left becomes the metal silicide layers 72 in the npn transistor region, and the metal silicide layer 74 (not shown) and the metal silicide layer 76 in the pnp transistor region. The first layered polycrystalline silicon 64 which is left becomes the p-type polycrystalline silicon layers 45 which are the base electrode in the npn transistor region, and the p-type polycrystalline silicon layer 48 (not shown) which is the collector electrode and the p-type polycrystalline silicon layer 50 which is the emitter electrode in the pnp transistor region.

Figure 5C:
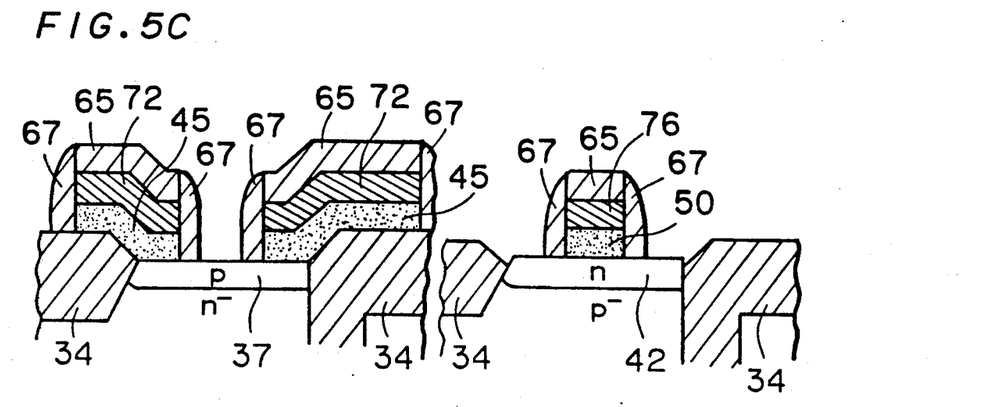

After the removal of the photo-resist pattern 66, an insulating film is deposited on the entire surface. By anisotropic etching, the sidewalls 67 which are insulators are formed on the side faces of the p-type polycrystalline silicon layers 45, the metal silicide layers 72 and the insulating films 65 in the npn transistor region and on the side faces of the p-type polycrystalline silicon layer 50, the metal silicide layer 76 and the insulating film 65 in the pnp transistor region, as shown in FIG. 5C. In the npn transistor region, the insulating films 47 of FIG. 4B are formed by the insulating films 65 and the sidewalls 67. In the pnp transistor region, the insulating film 51 of FIG. 4B is formed by the insulating film 65 and the sidewalls 67.

Figure 5D:
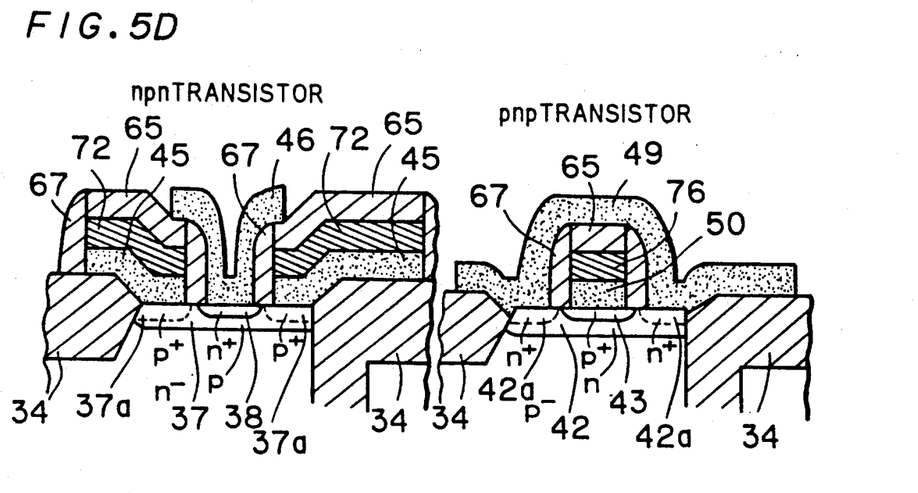
Figure 5E:
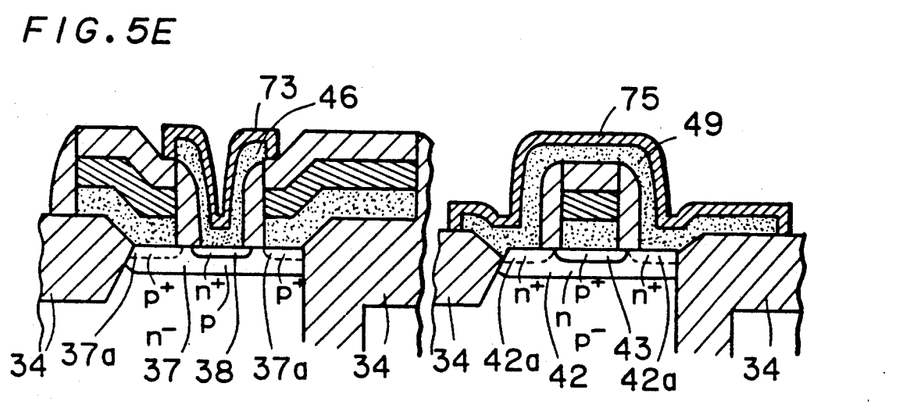

In the same manner as the step shown in FIG. 3J, on the entire surface is deposited the second layered polycrystalline silicon 68, which is rendered into n-type by introducing n-type impurities such as arsenic ($As^+$) on the entire surface thereof. Thereafter, as shown in FIG. 5D, the second layered polycrystalline silicon 68 is selectively etched away to leave a predetermined pattern. Accordingly, the n-type polycrystalline silicon layer 44 (not shown) in contact with the $n^+$ type collector extraction layer 36 and the n-type polycrystalline silicon layer 46 in contact with the p-type base diffusion region 37 are formed in the npn transistor region, while the n-type polycrystalline silicon layer 49 in contact with the n-type base diffusion region 42 is formed in the pnp transistor region. The n-type polycrystalline silicon layers 46 and 49 are insulated or isolated in self-alignment from the p-type polycrystalline silicon layers 45 and 50 by the sidewalls 67 and the insulating films 65. Impurities are diffused from the p-type and n-type polycrystalline silicon layers 45, 46, 49 and 50 by heat treatment, so that the $n^+$ type emitter diffusion region 38 and the $p^+$ type external base diffusion regions 37a are formed inside the p-type base diffusion region 37 in the npn transistor region, and the $p^+$ type emitter diffusion region 43 and the $n^+$ type external base diffusion regions 42a are formed inside the n-type base diffusion region 42 in the pnp transistor region.

Next, metal having high reactivity with silicon is deposited on the entire surface and is subjected to heat treatment. Thereby, the metal silicide is produced in self-alignment only on the n-type polycrystalline silicon layers 46 and 49 and the n-type polycrystalline silicon layer 44 (not shown) to form the metal silicide layers 73 and 75 and the metal silicide layer 71 (not shown). Alternatively, in the steps of FIGS. 5D and 5E, after the two-layer structure of the n-type polycrystalline silicon and the metal silicide is deposited on the entire surface, which is then subjected to the patterning, the n-type polycrystalline silicon layers (44), 46 and 49 and the metal silicide layers (71), 73 and 75 thereon may be formed.

Figure 5F:
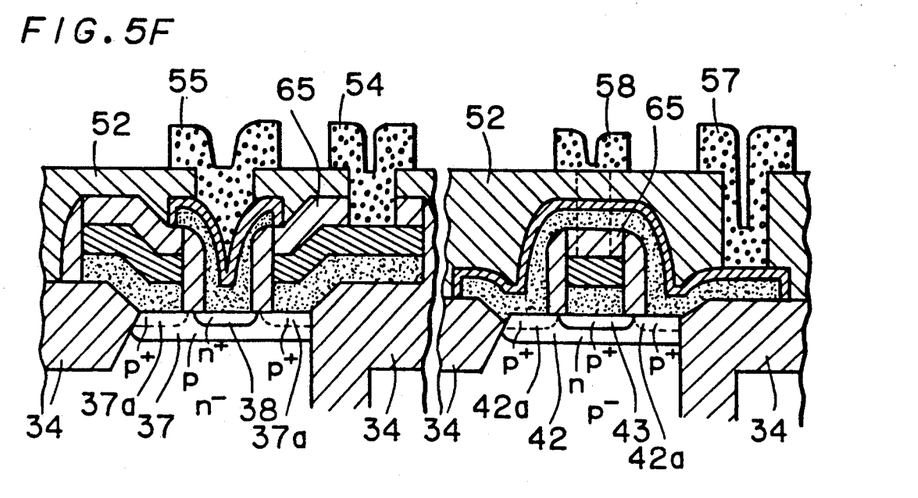

Finally, as shown in FIG. 5F, the entire surface is coated with the passivation film 52. Contact holes are bored in the passivation film 52 and the insulating films 65 there-underneath, which are subjected to metallizing treatment, thereby being formed the base and emitter metal wirings 54, 55, 57 and 58 and the collector metal wirings 53 and 56 not shown. Thus, the semiconductor device of FIG. 4B is accomplished.

Figure 7A:
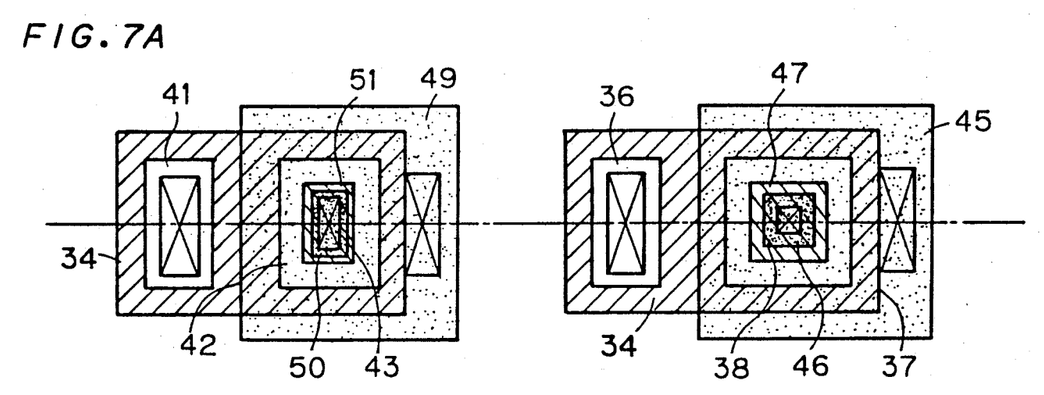
FIG. 7A is a plan view showing a plane pattern of a further embodiment of the semiconductor device according to the present invention.
Figure 7B:
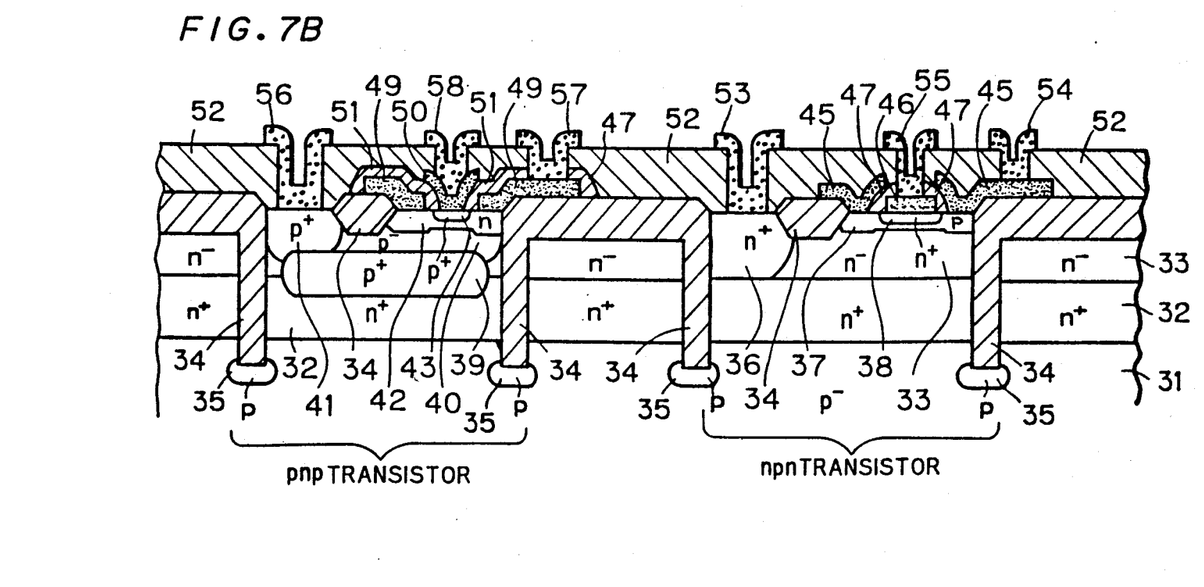
FIG. 7B is a cross-sectional view showing a cross-sectional structure taken along the line D—D of FIG. 7A.

FIG. 7A is a plan view showing a plane pattern of a further preferred embodiment of the semiconductor device according to the present invention. FIG. 7B is a cross-sectional view showing a cross-sectional structure taken along the line D—D of FIG. 7A. Compared with the preferred embodiment of FIGS. 1A and 1B, this preferred embodiment employs the structure of electrode parts in which the npn transistor and the pnp transistor are reversed. That is, the p-type polycrystalline silicon layer 45, n-type polycrystalline silicon layer 46 and insulating film 47 of the npn transistor in this preferred embodiment have the same structure as the n-type polycrystalline silicon layer 49, p-type polycrystalline silicon layer 50 and insulating film 51 of the pnp transistor in the preferred embodiment of FIGS. 1A and 1B, respectively. The n-type polycrystalline silicon layer 49, p-type polycrystalline silicon layer 50 and insulating film 51 of the pnp transistor in this preferred embodiment have the same structure as the p-type polycrystalline silicon layer 45, n-type polycrystalline silicon layer 46 and insulating film 47 of the npn transistor in the preferred embodiment of FIGS. 1A and 1B, respectively. Other structures and effects of this preferred embodiment are similar to those of the preferred embodiment of FIGS. 1A and 1B except that the positions of the npn and pnp transistors are laterally reversed.

The same is applicable to the preferred embodiments of FIGS. 2A, 2B and FIGS. 4A, 4B. That is, the preferred embodiments of FIGS. 2A, 2B and FIGS. 4A, 4B may employ the structure of electrode parts in which the npn transistor and the pnp transistor are reversed. In this case, similar effects can be attained.

A method of manufacturing the semiconductor device in this preferred embodiment will be easily inferred from FIGS. 3A to 3L or FIGS. 5A to 5F. For the fabrication, it is necessary only to apply the steps of manufacturing the electrode structures for the npn and pnp transistors to the pnp and npn transistors, respectively, in the steps of FIGS. 3A to 3L or FIGS. 5A to 5F. The conductivity types of the first and second layered polycrystalline silicons 64 and 68 are required to be reversed because of the reversed electrode structures. The p-type first layered polycrystalline silicon 64 should be replaced with n-type, while the n-type second layered polycrystalline silicon 68 should be replaced with p-type. The method of manufacturing the semiconductor device in this manner provides effects similar to the above-mentioned preferred embodiments.

Although the present invention has been described and illustrated in detail, it is clearly understood that the same is by way of illustration and example only and is not to be taken by way of limitation. The spirit and scope of the present invention should be limited only by the terms of the appended claims.

What is claimed is:

1. A semiconductor device having vertical npn and pnp bipolar transistors in which base, emitter and collector regions are respectively formed on the same semiconductor substrate, comprising:
    a first base electrode made up of a p-type conductive layer which is formed on said base region of said npn bipolar transistor;
    a first emitter electrode made up of a p-type conductive layer which is formed on said emitter region of said pnp bipolar transistor;
    a first insulating film which covers an entire surface of said first base electrode except a portion for a contact hole to said first base electrode, wherein portions of the entire surface of the first base electrode which are covered by the first insulating film include sidewall portions and substantially horizontal upper surface portions;
    a second insulating film which covers an entire surface of said first emitter electrode except a portion for a contact hole to said first emitter electrode, wherein porions of the entire surface of the first emitter electrode which are covered by the second insulating film include sidewall portions and substantially horizontal upper surface portions;
    a second emitter electrode made up of an n-type conductive layer which is formed on said emitter region of said npn bipolar transistor, said second emitter electrode being insulated from said first base electrode by said first insulating film; and
    a second base electrode made up of an n-type conductive layer which is formed on said base region of said pnp bipolar transistor, said second base electrode being insulated from said first emitter electrode by said second insulating film.

2. A semiconductor device in accordance with claim 1, further comprising
    a trench insulating film formed on said semiconductor substrate for isolating said npn and pnp bipolar transistors.

3. A semiconductor device in accordance with claim 2, wherein
    said collector region of said npn bipolar transistor includes an n-type buried collector layer, an n-type epitaxial layer formed on said n-type buried collector layer and an n-type collector extraction layer formed on said n-type buried collector layer,
    said base region of said npn bipolar transistor including a p-type base diffusion region formed on said epitaxial layer,
    said emitter region of said npn bipolar transistor including an n-type emitter diffusion region formed on said p-type base diffusion region,
    said collector region of said pnp bipolar transistor including a p-type buried collector layer, a p-type collector diffusion layer formed on said p-type buried collector layer and a p-type collector extraction layer formed on said p-type buried collector layer,
    said base region of said pnp bipolar transistor including an n-type base diffusion region formed on said collector diffusion layer,
    said emitter region of said pnp bipolar transistor including a p-type emitter diffusion region formed on said n-type base diffusion region.

4. A semiconductor device in accordance with claim 1, further comprising
    a passivation film formed on a top surface of said npn and pnp bipolar transistors,
    said passivation film having contact holes reaching therethrough said collector regions of said npn and pnp bipolar transistors, said second emitter electrode and said second base electrode, respectively,
    said passivation film and said first insulating film having a contact hole reaching therethrough said first base electrode,
    said passivation film and said second insulating film having a contact hole reaching therethrough said first emitter electrode, and
    metal interconnections formed in said contact holes.

5. A semiconductor device in accordance with claim 1, further comprising
    a first collector electrode made up of an n-type conductive layer which is formed on said collector region of said npn transistor,
    a second collector electrode made up of a p-type conductive layer which is formed on said collector region of said pnp transistor, and
    a third insulating film which coats said second collector electrode.

6. A semiconductor device in accordance with claim 5, further comprising
    a passivation film formed on a top surface of said npn and pnp bipolar transistors,
    said passivation film having contact holes reaching therethrough said first collector electrode, said second emitter electrode and said second base electrode, respectively, said passivation film and said first insulating film having a contact hole reaching therethrough said first base electrode, said passivation film and said second insulating film having a contact hole reaching therethrough said first emitter electrode, said passivation film and said third insulating film having a contact hole reaching therethrough said second collector electrode, and metal interconnections formed in said contact holes.

7. A semiconductor device in accordance with claim 5, further comprising metal silicide layers formed on said first and second base, emitter and collector electrodes.

8. A manufacturing method of a semiconductor device having vertical npn and pnp bipolar transistors in which base, emitter and collector regions are respectively formed on the same semiconductor substrate, comprising the steps of:

(a) preparing a semiconductor substrate;

(b) providing on said semiconductor substrate an n-type first island which becomes said collector region of said npn bipolar transistor and a p-type second island which becomes said collector region of said pnp bipolar transistor;

(c) selectively forming a surface of said first island a p-type first semiconductor region which becomes said base region of said npn bipolar transistor;

(d) selectively forming in a surface of said second island an n-type second semiconductor region which becomes said base region of said pnp bipolar transistor;

(e) selectively forming on said first semiconductor region a p-type first conductive layer which becomes a base electrode of said npn bipolar transistor and simultaneously on said second semiconductor region a p-type second conductive layer which becomes an emitter electrode of said pnp bipolar transistor, by forming a p-type conductive layer on an entire surface and patterning said p-type conductive layer;

(f) covering an entire surface of said first conductive layer with a first insulating film and simultaneously an entire surface of said second conductive layer with a second insulating film;

(g) selectively forming on said first semiconductor region an n-type third conductive layer which becomes an emitter electrode of said npn bipolar transistor while insulating said third conductive layer from said first conductive layer by said first insulating film, and simultaneously selectively forming on said second semiconductor region an n-type fourth conductive layer which becomes a base electrode of said pnp bipolar transistor while insulating said fourth conductive layer from said second conductive layer by said second insulating film, by forming an n-type conductive layer on an entire surface and patterning said n-type conductive layer; and (h) diffusing n-type impurities from said fourth conductive layer to said first semiconductor region to form selectively in a surface of said first semiconductor region an n-type third semiconductor region which becomes said emitter region of said npn bipolar transistor, and simultaneously diffusing p-type impurities from said second conductive layer to said second semiconductor region to form selectively in a surface of said second semiconductor region a p-type fourth semiconductor region which becomes said emitter region of said pnp bipolar transistor, by heat treatment.

9. A manufacturing method of a semiconductor device in accordance with claim 8, wherein said semiconductor substrate is p-type, said step (b) comprising the steps of forming an n-type buried layer on said semiconductor substrate, forming a p-type collector buried layer selectively on said n-type buried layer, epitaxially growing an n-type epitaxial layer on said n-type buried layer and p-type collector buried layer, forming a trench insulating film reaching said substrate from a surface of said epitaxial layer to form said first island not including said p-type collector buried layer and said second island including said p-type collector buried layer, forming an n-type collector extraction layer in said epitaxial layer in said first island to reach said n-type buried layer from a surface of said epitaxial layer, and forming a p-type collector diffusion layer and a p-type collector extraction layer in said epitaxial layer in said second island to reach said p-type collector buried layer from the surface of said epitaxial layer.

10. A manufacturing method of a semiconductor device in accordance with claim 8, wherein said step (f) includes the steps of forming an insulating film on said first and second conductive layers, and forming an insulating side wall at respective side edges of said first and second conductive layers.

11. A manufacturing method of a semiconductor device in accordance with claim 8, further comprising the steps of forming a passivation film on a top surface of said npn and pnp bipolar transistors, forming contact holes reaching said collector regions of said npn and pnp bipolar transistors and said third and fourth conductive layers, respectively, through said passivation film, a contact hole reaching said first conductive layer through said passivation film and said first insulating film, and a contact hole reaching said second conductive layer through said passivation film and said second insulating film, and forming metal interconnections in said contact holes.

12. A manufacturing method of a semiconductor device in accordance with claim 8, further comprising the steps of selectively forming on said second island a p-type fifth conductive layer which becomes a collector electrode of said pnp bipolar transistor simultaneously with said step (e), coating said fifth conductive layer with a third insulating film simulataneously with said step (f), and selectively forming on said first island an n-type sixth conductive layer which becomes a collector electrode of said npn bipolar transistor simultaneously with said step (g).

13. A manufacturing method of a semiconductor device in accordance with claim 12, further comprising the steps of forming a passivation film on a top surface of said npn and pnp bipolar transistors, forming contact holes reaching said third, fourth and sixth conductive layers, respectively, through said passivation film, a contact hole reaching said first conductive layer through said passivation film and said first insulating film, a contact hole reaching said second conductive layer through said passivation film and said second insulating film and a contact hole reaching said fifth conductive layer through said passivation film and said third insulating film, and forming metal interconnections in said contact holes.

14. A manufacturing method of a semiconductor device in accordance with claim 8, further comprising the steps of forming a metal silicide layer on said first and second conductive layers, between said steps (e) and (f), said step (f) including the step of coating said metal silicide layer in addition to said first and second conductive layer with said first and second insulating film, and forming another metal silicide layer on said third and fourth conductive layers.

15. A semiconductor device having vertical pnp and npn bipolar transistors in which base, emitter and collector regions are respectively formed on the same semiconductor substrate, comprising:

a first base electrode made up of an n-type conductive layer which is formed on said base region of said pnp bipolar transistor;

a first emitter electrode made up of an n-type conductive layer which is formed on said emitter region of said npn bipolar transistor;

a first insulating film which covers an entire surface of said first base electrode except a portion for a contact hole to said first base electrode, wherein portions of the entire surface of the first base electrode which are covered by the first insulating film include sidewall portions and substantially horizontal upper surface portions;

a second insulating film which covers an entire surface of said first emitter electrode except a portion for a contact hole to said first emitter electrode, wherein portions of the entire surface of the first emitter electrode which are covered by the second insulating film include sidewall portions and substantially horizontal upper surface portions;

a second emitter electrode made up of a p-type conductive layer which is formed on said emitter region of said pnp bipolar transistor, said second emitter electrode being insulating from said first base electrode by said first insulating film; and a second base electrode made up of a p-type conductive layer which is formed on said base region of said npn bipolar transistor, said second base electrode being insulated from said first emitter electrode by said second insulating film.

16. A manufacturing method of a semiconductor device having vertical pnp and npn bipolar transistors in which base, emitter and collector regions are respectively formed on the same semiconductor substrate, comprising the steps of:

(a) preparing a semiconductor substrate; (b) providing on said semiconductor substrate a p-type first island which becomes said collector region of said pnp bipolar transistor and an n-type second island which becomes said collector region of said npn bipolar transistor;

(c) selectively forming in a surface of said first island an n-type first semiconductor region which becomes said base region of said pnp bipolar transistor;

(d) selectively forming in a surface of said second island a p-type second semiconductor region which becomes said base region of said npn bipolar transistor;

(e) selectively forming on said first semiconductor region an n-type first conductive layer which becomes a base electrode of said pnp bipolar transistor and simultaneously selectively forming on said second semiconductor region an n-type second conductive layer which becomes an emitter electrode of said npn bipolar transistor, by forming an n-type conductive layer on an entire surface and patterning said n-type conductive layer;

(f) covering an entire surface of said first conductive layer with a first insulating film and simultaneously covering an entire surface of said second conductive layer with a second insulating film;

(g) selectively forming on said first semiconductor region a p-type third conductive layer which becomes an emitter electrode of said pnp bipolar transistor while insulating said third conductive layer from said first conductive layer by said first insulating film, and simultaneously selectively forming on said second semiconductor region a p-type fourth conductive layer which becomes a base electrode of said npn bipolar transistor while insulating said fourth conductive layer from said second conductive layer by said second insulating film, by forming a p-type conductive layer on an entire surface and patterning said p-type conductive layer; and (h) diffusing p-type impurities from said fourth conductive layer to said first semiconductor region to form selectively in a surface of said first semiconductor region a p-type third semiconductor region which becomes said emitter region of said pnp bipolar transistor, and simultaneously diffusing n-type impurities from said second conductive layer to said second semiconductor region to form selectively in a surface of said second semiconductor region an n-type fourth semiconductor region which becomes said emitter region of said npn bipolar transistor, by heat treatment.

* * * * *